United States Patent
Dangelmayer et al.

(10) Patent No.: US 6,541,988 B2
(45) Date of Patent: Apr. 1, 2003

(54) CIRCUIT BOARD TEST FIXTURE WITH ELECTROSTATIC DISCHARGE (ESD) PROTECTION

(75) Inventors: George T. Dangelmayer, Plaistow, NH (US); John P. Franey, Bridgewater, NJ (US); Timothy L. Pernell, East Orange, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/879,476

(22) Filed: Jun. 12, 2001

(65) Prior Publication Data

US 2002/0186029 A1 Dec. 12, 2002

(51) Int. Cl.$^7$ .............................................. G01R 31/02
(52) U.S. Cl. ....................................... 324/754; 324/761
(58) Field of Search ................................. 324/754, 761, 324/762, 763, 765, 766, 725; 439/482, 700; 361/56, 111, 780, 774

(56) References Cited

U.S. PATENT DOCUMENTS

| | | | |
|---|---|---|---|
| 4,686,465 A | * 8/1987 | Kruger | 324/754 |
| 4,814,698 A | 3/1989 | St. Onge et al. | |
| 5,373,233 A | 12/1994 | Brunner et al. | |
| 5,663,655 A | * 9/1997 | Johnston et al. | 324/110 |
| 5,808,475 A | 9/1998 | Knauer et al. | |
| 5,963,415 A | 10/1999 | Johansen | |
| 6,222,377 B1 | * 4/2001 | Kato | 324/754 |

* cited by examiner

Primary Examiner—Kamand Cuneo
Assistant Examiner—Tung X. Nguyen
(74) Attorney, Agent, or Firm—Duane Morris, LLP

(57) ABSTRACT

A device including a probe plate including a plurality of test pins, a conductive layer disposed in proximity to the probe plate and including a plurality of openings therein corresponding the plurality of test pins and, an insulator layer disposed on the conductive layer and including a plurality of openings therein corresponding the plurality of test pins.

14 Claims, 3 Drawing Sheets

CIRCUIT BOARD TEST FIXTURE WITH ELECTROSTATIC DISCHARGE (ESD) PROTECTION

FIELD OF THE INVENTION

The present invention relates to test fixtures for use in testing printed circuit boards, and in particular, test fixtures which include electrostatic discharge (ESD) protection.

DESCRIPTION OF THE RELATED ART

Automatic test equipment for checking printed circuit boards (PCBs) has long been well known. For the sake of consistency and convenience, the printed circuit board and the circuitry thereon to be checked, such as components and lead lines therebetween, will be referred to hereafter as a "unit under test", or "UUT." A standard and well known test approach utilizes a "bed of nails" test fixture in which a great number of arrayed, nail-like test probes are provided, each having a tip arranged to make electrical contact with a designated test point of the UUT.

Any particular circuit laid out on a printed circuit board is likely to be different from all other circuits. Consequently, a "bed of nails" arrangement for contacting test points in a particular circuit must be customized for each circuit. When the circuit to be tested is designed, a pattern of test points to be used in checking the circuit is selected, and a corresponding array of test probes are configured in a test fixture. A typical test fixture may have five hundred (500) test probes, and possibly up to two thousand (2000) or more test probes.

It is commonly known that electrostatic discharge (ESD) can cause serious damage to semiconductor devices. Damage can occur by way of junction burnout when a localized voltage is induced by an electrostatic potential. If a sufficient current flows due to the induced electrostatic potential, thermal secondary breakdown can occur, thereby destroying the junction.

Another type of damage is dielectric breakdown which occurs when the induced potentials are of a magnitude high enough to "punch through" the insulating layer of silicon dioxide which protects the gate of Field Effect Transistors (FETs) and Metal-Oxide Silicon (MOS) type semiconductors.

Furthermore, metallization melt is another type of damage due to electrostatic discharge. Bond wires or metallization strips within the semiconductor burn out, like a fuse, when high currents induced by the electrostatic potential occur.

Various sources for developing an electrostatic potential exist in the work place. For example, electrostatic charge can accumulate due to the well known triboelectric effect generated during the normal act of walking across, for example, the surface of a rug. For example, a worker accumulates a charge which creates a field between himself and nearby grounded objects. Then, any objects placed in that field will have a voltage induced on them depending on their size and orientation. Such a voltage can easily exceed five thousand (5000) volts. Likewise, if a worker with such an accumulated static charge on him touches an electronic component, currents will flow through the semiconductor of the component and eventually to ground. The resultant voltage can cause dielectric breakdown or melt metallization.

It is well known that circuits are exposed to potentially damaging electrostatic charges in the course of being checked on automatic test equipment of the type such as briefly described above. An electrostatic charge can be built up on the printed circuit board as it is being moved from one location to another due to, for example, the triboelectric effect discussed above which occurs as the person carrying it walks along. Also, when vacuum is used to exert a force on the UUT to engage it against the bed of nails, air rushes through vents in the test fixture during the application of vacuum as well as the release of a vacuum. The friction of air particles moving against fixture surfaces is a source of electrostatic charge build-up. Furthermore, various fixture seals undergo a certain degree of motion as the vacuum is applied and the UUT is brought into engagement with the "bed of nails". This motion is a further source of electrostatic charge build-up.

Electrostatic voltages generated by the above-described causes can reach as high as one thousand (1000) volts from the top plate and up to five thousand (5000) volts inside the vacuum well of the fixture. Such electrostatic potentials far exceed the static susceptibility range of MOSFET chips (100 to 200 volts) as well as ECL bipolar devices (up to 500 volts).

A further concern besides rendering the semiconductor components inoperative is the electrostatic overstress effect. It can be caused even by an electrostatic charge which is only 25% of the static susceptibility values mentioned just above. This effect is such that the components seem to have survived the static without damage. However, it can cause parametric degradation, as well as cause the component to fail well before its specified mean time between failures. As integrated circuits are made with ever finer lines and ever thinner oxide layers, the danger of static will further aggravate the electrostatic overstress effect.

In order to protect the UUT from being damaged during the testing operation, it is desirable to accomplish several aims. Since it is not unlikely that an electrostatic charge will somehow accumulate on the test fixture, it is desirable to dissipate that charge relatively quickly, but not instantaneously such as undesirably occurs in an electrostatic discharge to ground with its attendant damaging effects. It is also desirable to prevent the test fixture itself from generating an electrostatic charge during operation of the automatic test equipment. In addition, if an undissipated electrostatic charge remains on the test fixture, it is desirable to prevent a spark from passing from the UUT to the test fixture when, for example, the operator brings the UUT towards the test fixture for mounting thereon.

Various approaches have been developed in an attempt to effectively deal with the electrostatic charges developed on a test fixture due to a variety of causes including those mentioned above. One approach is to ground the operator, such as by a wrist strap connected to ground. Although this eliminates the build-up of electrostatic charges due to the effect of the worker, it completely fails to deal with the other causes listed above.

Another approach utilizes an ionizer to blow ionized air across the fixture. However, its effect has been found to be limited because of the inability to access areas beneath the UUT where static charge is actually generated.

In yet another approach, an antistatic spray is applied to the fixture. However, this requires disassembly of the fixture which is a somewhat laborious operation. Also, the spray has to be reapplied relatively frequently, such as at one week intervals because it rubs off easily, evaporates (i.e. sublimes) or its electrical characteristics degrade. Also, such sprays are humidity dependent in their ability to prevent static buildup.

More recently, as described in U.S. Pat. No. 4,814,698 to St. Onge, et al., an anti-static coating 68 having a certain critical resistivity has been applied to areas of a test fixture 10 to reduce ESD (See FIG. 3). However, the test fixture 10 described by St. Onge is clearly for use with devices operating at relatively low frequencies. At frequencies between 1 Gigahertz (Ghz) and 60 Ghz, the anti-static coating 68 forms a shunt (i.e., short circuit) to ground for all active high frequency signals. This occurs because the impedance of the high speed (frequency) circuits greatly exceeds the static dissipative range for the coating 68. For example, the coating 68 has a resistivity in a range from $10^5$–$10^{10}$ ohms/sq. (See Abstract). Thus, at a frequency such as 500 MHZ, the coating will operate properly as a static dissipative layer. However, at higher frequencies (such as 1 GHz and above), the resistivity of the coating 68 will decrease, and the coating will act as a short circuit to ground.

Additionally, as described in U.S. Pat. No. 5,663,655 to Johnston et al., test fixtures which include ESD protection layers are known. Johnston shows a universal grid tester 10 which includes a grounding layer 26 to protect the device under test from ESD. The grounding layer 26 connects to spring-loaded plunger pins 22 of the tester 10 through a ground plane contact section 24 (See FIG. 3). However, the tester 10 described by Johnston includes many elements for transferring test signals to printed circuit board (PCB) under test 36. In particular, test signals are supplied to the PCB from switch cards 46, 48 to terminal pins 30, through barrel 24, through spring 54, and through pin 22 to receptacle 20 which contacts the PCB. This multitude of connections between the signal source and the PCB will cause each pin to receive slightly different signals due to the slight differences in DC resistance of the members (barrel 24, spring 54, etc.), especially with high frequency test signals (1 GHz and above). Additionally, as the frequency of the test signals increases, small variations in the DC resistance of the members will cause large swings in the AC test signals provided to the PCB.

Therefore, there is currently a need for a circuit test fixture which operates effectively at high frequencies.

SUMMARY OF THE INVENTION

The present invention is a device including a probe plate including a plurality of test pins, a conductive layer disposed in proximity to the probe plate and including a plurality of openings therein corresponding the plurality of test pins and, an insulator layer disposed on the conductive layer and including a plurality of openings therein corresponding the plurality of test pins.

The above and other advantages and features of the present invention will be better understood from the following detailed description of the preferred embodiments of the invention which is provided in connection with the accompanying drawings.

DETAILED DESCRIPTION

Figure 1:
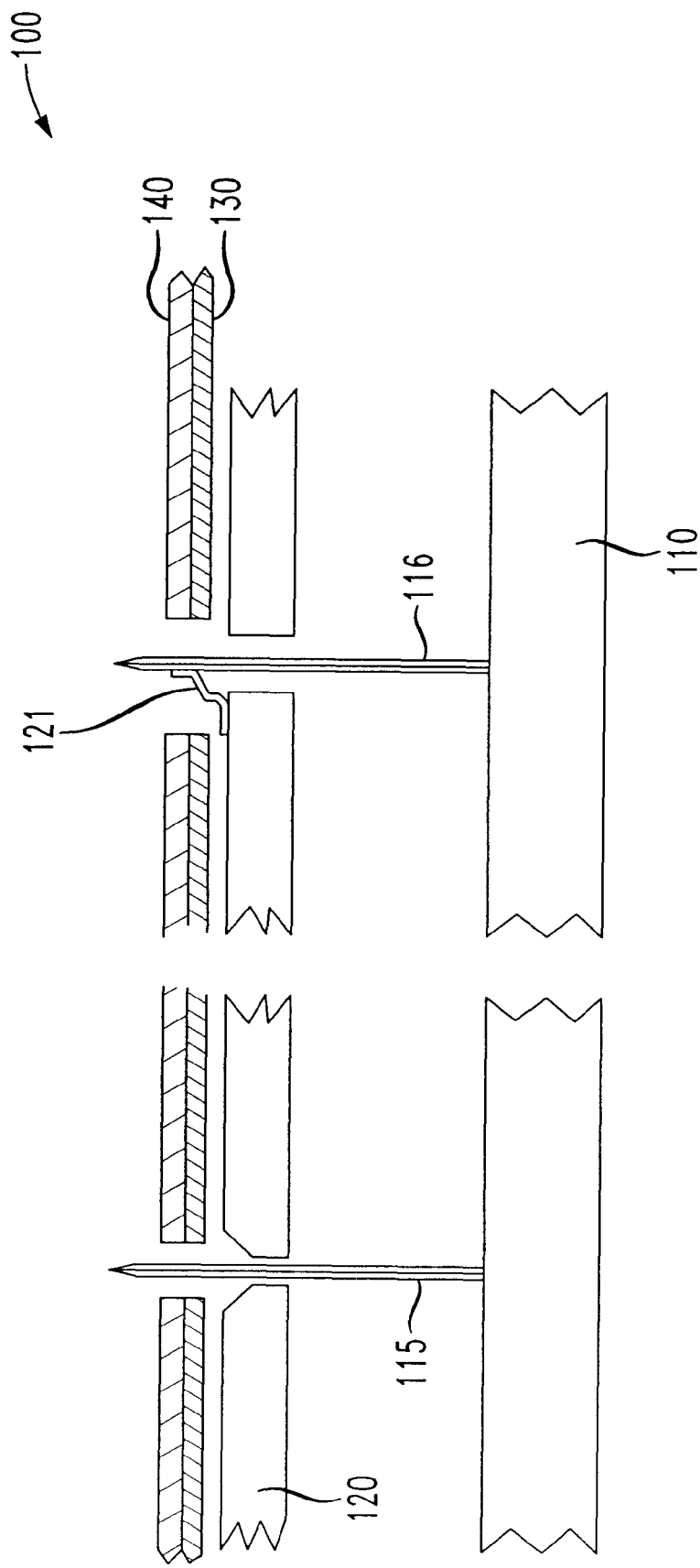
FIG. 1 shows a cross-section view of a test structure according to a first exemplary embodiment of the present invention.

Referring to FIG. 1, there is shown a circuit test fixture 100 according to a first exemplary embodiment of the present invention. As is well known in the art, the test fixture 100 is utilized for testing electrical circuits, such as the kind disposed on a printed circuit board (PCB). The test fixture 100 includes a probe plate 110 with a plurality of test pins 115 disposed therein. Preferably, and as is well known in the art, the test pins 115 are removable from the probe plate 110 so as to create different arrays of testing patterns corresponding to different circuits to be tested. As is known in the art, the test pins 115 may be secured to the probe plate 110 by threads disposed on the pins and the probe plate, or other well known fastening means. The probe plate 110 also includes a plurality of ground pins 116 disposed around the outer periphery of the probe plate. The ground pins 116, although also removable, are preferably not removed from the probe plate 110. Each of the ground pins 116 are coupled to a ground layer 120 through a wire bond 121, or through other methods well known to those skilled in the art.

The test fixture 100 also includes a conductive layer 130 disposed on the ground layer 120, and an insulator layer 140 disposed on the conductive layer 130. The conductive layer 130 operates to reduce the charge transferred to a test circuit (i.e., PCB) by test pins 115. The conductive layer 130 may have a thickness in a range from 0.00001–0.0004 millimeters (mm). Additionally, the conductive layer 130 preferably has a resistivity less than 10 Ohms ($\Omega$). The layer 130 can be a metallic deposition, copper sheet, highly conductive carbon or carbon-metal composite, or other types of materials that provide and equivalent conductive media.

The insulator layer 140 operates to create a barrier between the circuits disposed on the PCB and the conductive layer 130. Without this insulator layer 140, the circuits disposed on the PCB would be shorted by the conductive layer 130. The insulator layer 140 may have a thickness in a range from 1–5 mm, with thinner insulator layers being preferred. It should be noted that greater potential suppression occurs when the ground layer 120 is closer to the device tested (i.e., thinner insulator layer 140). The greater the potential suppression is, the greater the protective nature of the device 100.

Figure 2:
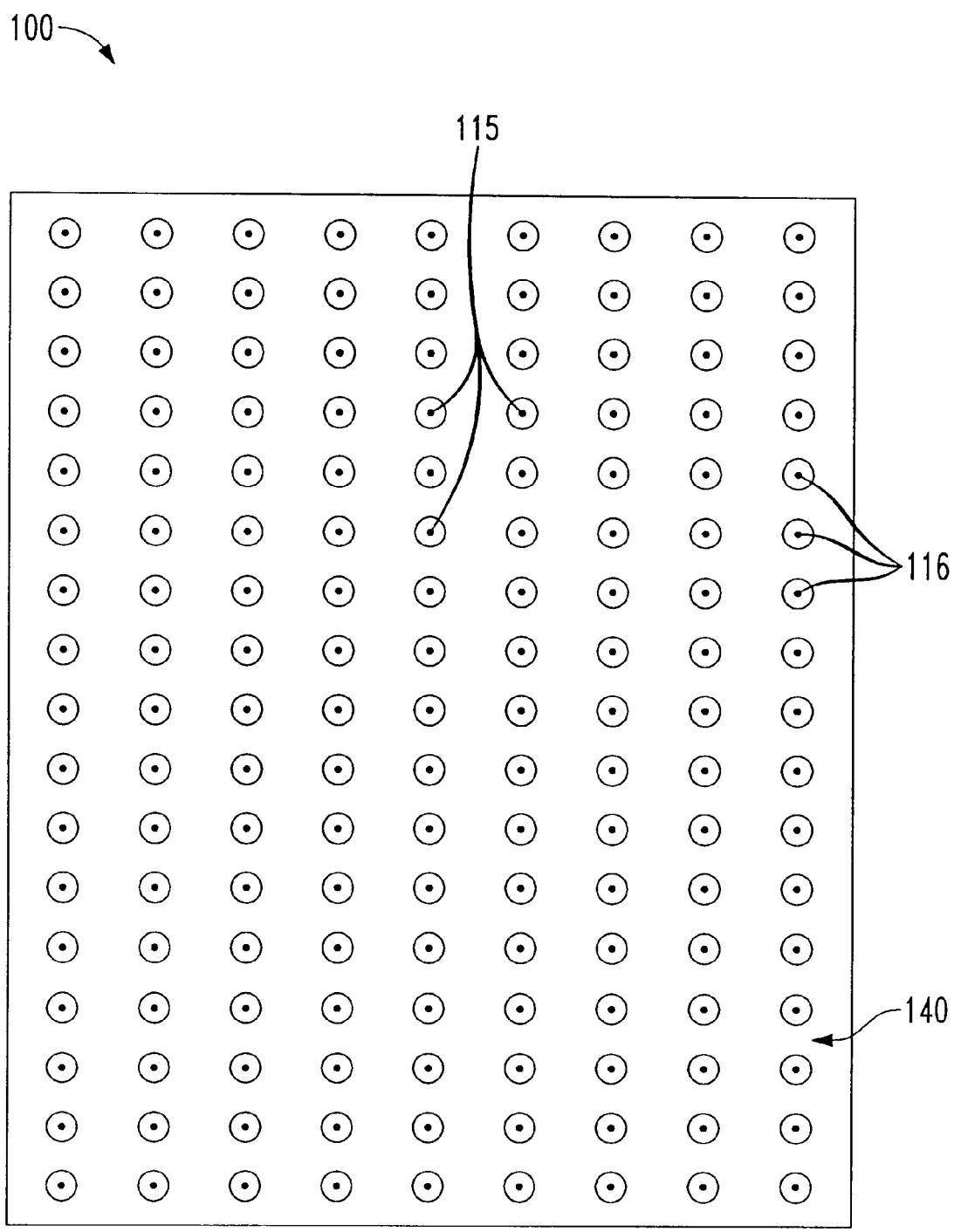
FIG. 2 shows a top plan view of the test structure shown in FIG. 1.

FIG. 2 shows an overhead view of the test fixture 100 shown in FIG. 1. As will be understood, the test fixture 100 includes a plurality of test pins 115 and ground pins 116 arranged in a grid pattern. Although a rectangular pattern is shown in FIG. 2, other grid patterns (circles, etc.) are of course not specifically excluded by the present invention. As shown in FIG. 2, the insulator layer 140, and the first and second ground layers 120, 130 which underlie the insulator layer, all preferably include circular openings therein so that the pins 115, 116 may pass therethrough.

Although not shown, the test fixture 100 may include various means (clamps, pressing members, etc.) for securing a PCB to the test fixture, such as are well known in the art.

The above-described construction effectuates a 'proximity grounding' of the test fixture. It will be noted by those skilled in the art that by bringing an electrically conductive layer (e.g., layer 130) in close proximity to an insulator (e.g., insulator layer 140), any induced triboelectric charge in the insulator layer is substantially reduced. This occurs because any triboelectric charge induced in the insulator layer 140 is transferred to the conductive layer 130 and carried away from the test fixture.

In many prior art designs, a single insulator layer was utilized as the uppermost layer of the test fixture (i.e., the layer which contacts the tested circuit or PCB). Thus, if triboelectric charge accumulated on the single insulator layer, such charge would be transferred to the PCB when the PCB was placed on the test fixture for testing. By utilizing a 'dual' layer comprising a conductive layer 130 and an insulating layer 140, triboelectric charge is effectively dissipated (i.e., by conductive layer 130). Moreover, the insulator layer 140 prevents a short circuit from forming between the circuits disposed on the PCB and the conductive layer 130.

Figure 3:
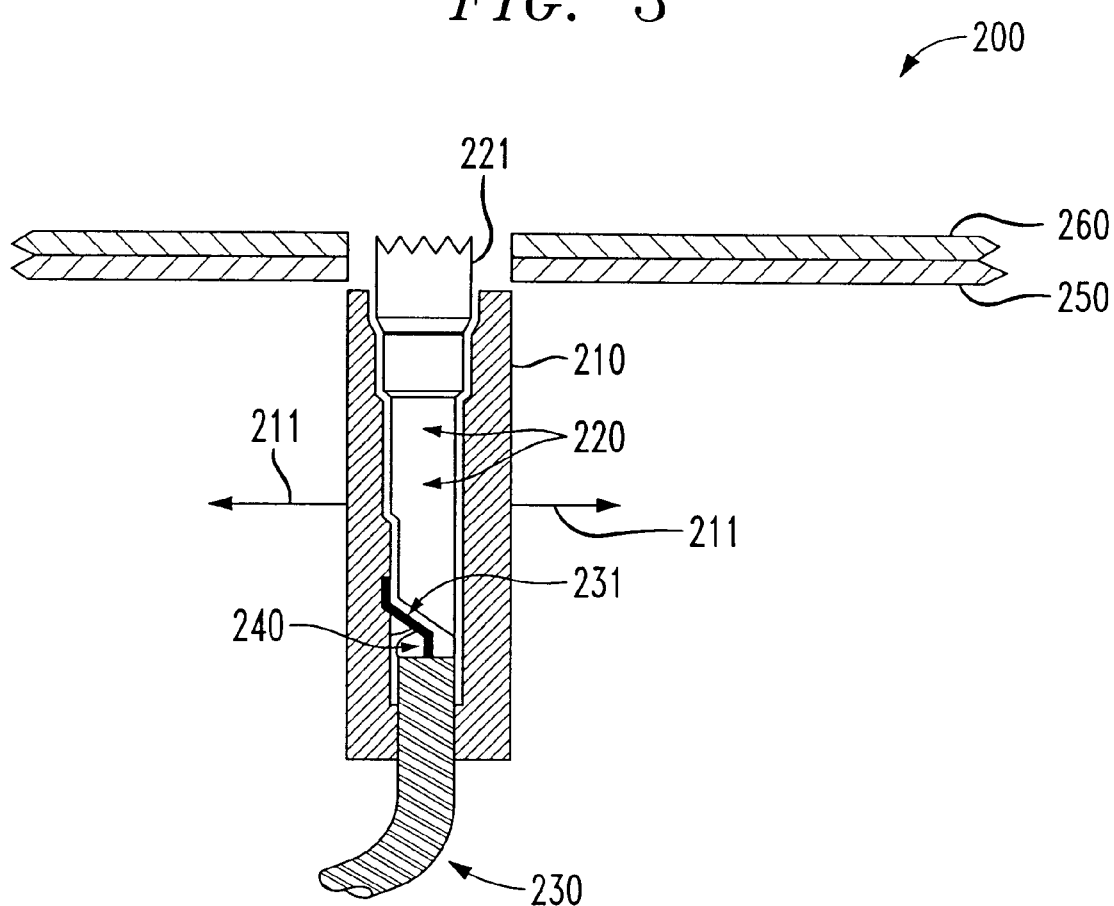
FIG. 3 shows an enlarged cross-section view of a test structure according to a first exemplary embodiment of the present invention.

Referring to FIG. 3, there is shown a circuit test fixture 200 according to a second exemplary embodiment of the present invention. The test fixture 200 is somewhat similar to the test fixture 100 shown in FIG. 1 in that it is comprised of a grid of test pins and ground pins, and includes ground and insulator layers, however, there are several differences between the two test fixtures, as will be described below. Test fixture 200 has oversize electrode design that is preferably used for testing high current circuits. The oversize electrode design is meant to prevent overheating which would occur in such high current flow circuits.

The test fixture 200 includes a first insulator layer 210, preferably made of plastic, which extends over the entire area of the test fixture as shown by the arrows 211. For the sake of clarity and simplicity, only a small portion of the first insulator layer 210 is shown in FIG. 3.

The insulator layer 210 houses a plurality of pins 220 (both test and ground) which are situated therein. The pins 220 include a contact portion 221 which extends outside the first insulator layer 210, and which is used to contact a PCB. The test fixture 200 also includes a ground layer 250 and a second insulator layer 260, similar to the ground and insulator layers 130, 140 shown in test fixture 100 (FIG. 1), and described above.

Contact to the pins 220 of the test fixture 200 may be made via a retention slot 240 disposed at a lower portion of the pins. A wire 230 (preferably for carrying a test signal) is used to make contact to the pins 220 at the retention slot 240. In particular, one end of the wire 230 is partially stripped of its insulative coating to expose the bare wire 231. The bare wire 231 is then inserted in the retention slot 240 and held thereby.

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. A device comprising:
   a probe plate including a plurality of test pins;
   a ground plate disposed in proximity to the probe plate and including a plurality of openings therein corresponding to the plurality of test pins, said ground plate including first and second opposing sides;
   a conductive layer disposed directly on the first side of the ground plate and including a plurality of openings therein corresponding the plurality of test pins; and,
   an insulator layer disposed on the conductive layer and including a plurality of openings therein corresponding the plurality of test pins,
   wherein the second side of the ground plate confronts the probe plate and the plurality of test pins.

2. The device of claim 1, wherein at least a first portion of the plurality of test pins are removable from the probe plate.

3. The device of claim 1, wherein the conductive layer has a thickness in a range from 0.00001–0.0004 millimeters.

4. The device of claim 1, wherein the insulator layer has a thickness in a range 1–5 millimeters.

5. The device of claim 1, wherein the conductive layer comprises a metal layer.

6. A test fixture for reducing electrostatic discharge, comprising:
   a probe plate including a plurality of test pins;
   a ground plate disposed in proximity to the probe plate and including a plurality of openings therein corresponding to the plurality of test pins, said ground plate including first and second opposing sides;
   a conductive layer disposed directly on the first side of the ground plate and including a plurality of openings therein corresponding the plurality of test pins; and,
   an insulator layer disposed on the conductive layer and including a plurality of openings therein corresponding the plurality of test pins,
   wherein the second side of the ground plate confronts the probe plate and the plurality of test pins.

7. The test fixture of claim 6, wherein at least a first portion of the plurality of test pins are removable from the probe plate.

8. The test fixture of claim 6, wherein the conductive layer has a thickness in a range from 0.00001–0.0004 millimeters.

9. The test fixture of claim 6, wherein the insulator layer has a thickness in a range 1–5 millimeters.

10. The test fixture of claim 6, wherein the conductive layer comprises a metal layer.

11. A method for protecting circuits disposed in a test fixture from electrostatic discharge, comprising the steps of:
    disposing a sandwich structure include a ground plate, an insulator layer and a conductive layer in proximity to a probe plate of the test fixture, said probe plate including pins for contacting circuits to be tested,
    wherein the ground plate of the sandwich structure confronts the probe plate of the test fixture, the conductive layer is disposed on a face of the ground plate, and the insulator layer is disposed on a face of the conductive layer opposite the ground plate.

12. The method of claim 10, wherein the conductive layer comprises a metal layer.

13. The method of claim 10, wherein the conductive layer has a thickness in a range from 0.00001–0.0004 millimeters.

14. The method of claim 10, wherein the insulator layer has a thickness in a range 1–5 millimeters.

* * * * *